United States Patent
Lin et al.

(10) Patent No.: US 9,385,127 B2
(45) Date of Patent: Jul. 5, 2016

(54) METHOD AND APPARATUS FOR SUPPRESSING METAL-GATE CROSS-DIFFUSION IN SEMICONDUCTOR TECHNOLOGY

(71) Applicant: Xilinx, Inc., San Jose, CA (US)

(72) Inventors: Qi Lin, Cupertino, CA (US); Hong-Tsz Pan, Cupertino, CA (US); Yun Wu, San Jose, CA (US); Bang-Thu Nguyen, Santa Clara, CA (US)

(73) Assignee: XILINX, INC., San Jose, CA (US)

( * ) Notice: Subject to any disclaimer, the term of this patent is extended or adjusted under 35 U.S.C. 154(b) by 68 days.

(21) Appl. No.: 13/973,616

(22) Filed: Aug. 22, 2013

(65) Prior Publication Data
US 2015/0054085 A1 Feb. 26, 2015

(51) Int. Cl.
*H01L 21/70* (2006.01)
*H01L 27/092* (2006.01)
*H01L 21/8238* (2006.01)

(52) U.S. Cl.
CPC ........ *H01L 27/0928* (2013.01); *H01L 21/8238* (2013.01); *H01L 21/823842* (2013.01); *H01L 21/823871* (2013.01); *H01L 27/092* (2013.01)

(58) Field of Classification Search
CPC ............ H01L 27/0928; H01L 21/8238; H01L 27/088; H01L 29/1079; H01L 29/66954; H01L 29/745; H01L 27/092
USPC .......... 257/204, 274, 350, E27.046, 206, 371, 257/288, 368, 369; 438/153, 199, 223, 627, 438/151, 197
See application file for complete search history.

(56) References Cited

U.S. PATENT DOCUMENTS

| | | | |
|---|---|---|---|
| 6,034,401 A | 3/2000 | Hsia et al. | |
| 2007/0284671 A1 | 12/2007 | Tsutsumi et al. | |
| 2013/0026579 A1 | 1/2013 | Lu et al. | |
| 2013/0178039 A1* | 7/2013 | Ko | H01L 21/02 438/382 |
| 2013/0320452 A1* | 12/2013 | Wann | H01L 21/823425 257/368 |
| 2014/0099784 A1* | 4/2014 | Kim | H01L 21/76801 438/589 |
| 2014/0206161 A1* | 7/2014 | Perng | H01L 21/823828 438/212 |
| 2014/0239396 A1* | 8/2014 | Liu | H01L 21/28008 257/347 |

OTHER PUBLICATIONS

Hamaguchi, M. et al., "New Layout Dependency in High-K/Metal Gate MOSFETs", IEEE IEDM 2011, 2011 IEEE International Electron Devices Meeting (IEDM), Dec. 5-7, 2011, pp. 25.6.1-25.6.4, Washington, D.C. US.

* cited by examiner

*Primary Examiner* — Jarrett Stark
*Assistant Examiner* — Shahed Ahmed
(74) *Attorney, Agent, or Firm* — Gerald Chan; Keith Taboada; Robert M. Brush

(57) ABSTRACT

An inverter includes: a PMOS comprising: a p-type source region, a p-type drain region, a p-channel region between the p-type source region and the p-type drain region, and a PMOS metal gate region; a NMOS, comprising: an n-type source region, an n-type drain region, an n-channel region between the n-type source region and the n-type drain region, and a NMOS metal gate region; an insulating layer above the p-channel region and the n-channel region, wherein the PMOS metal gate region and the NMOS metal gate region are above the insulating layer; and a gate contact between the NMOS metal gate region and the PMOS metal gate region.

13 Claims, 10 Drawing Sheets

METHOD AND APPARATUS FOR SUPPRESSING METAL-GATE CROSS-DIFFUSION IN SEMICONDUCTOR TECHNOLOGY

FIELD

An embodiment described herein relates generally to semiconductor technology, and in particular to a method and apparatus for suppressing metal-gate cross-diffusion in semiconductor technology

BACKGROUND

A basic semiconductor circuit, known as an inverter, includes a p-type MOSFET (PMOS) coupled with an n-type MOSFET (NMOS). An input is coupled to the gate of both the PMOS and the gate of the NMOS, and an output is coupled to a drain of the PMOS and a drain of the NMOS.

Conventionally, the gate of the NMOS is fabricated by first forming an insulating layer(s) above an n-channel region of the NMOS and then forming a NMOS metal gate region above the insulating layer(s). Likewise, the gate of the PMOS is fabricated by first forming an insulating layer above a p-channel region of the PMOS and then forming a PMOS metal gate region above the insulating layer(s). Typically, the same insulating layer(s) is shared by both the PMOS and the NMOS, and the NMOS metal gate region and PMOS metal gate region are adjacent to each other.

The NMOS metal gate region may include a NMOS barrier layer, one or more NMOS work function layers and a NMOS metal gate layer. The NMOS barrier layer surrounds the NMOS work function layers and the NMOS metal gate layer. Likewise, the PMOS metal gate region includes a PMOS barrier layer, one or more PMOS work function layers and a PMOS metal gate layer. The PMOS barrier layer surrounds the PMOS work function layers and the PMOS metal gate layer.

The NMOS work function layers and PMOS work function layers differ in composition. Depending on the particular configuration (e.g., composition) of work function layers, the threshold voltage associated with the NMOS or the PMOS may differ. Because of the close proximity between the NMOS metal gate region and the PMOS metal gate region, cross-diffusion between the work function layers and metal gate layers of the NMOS metal gate region and PMOS metal gate region may occur leading to unwanted shifts in threshold voltages for either the NMOS or the PMOS.

One approach for reducing cross-diffusion between the metal gate regions of the NMOS and PMOS is to increase the distance between the metal gate regions of the NMOS and PMOS. Another approach for reducing cross-diffusion between the metal gate regions of the NMOS and PMOS is to increase the thickness of the NMOS barrier layer and PMOS barrier layer.

New approach for reducing cross-diffusion between the metal gate regions of the NMOS and PMOS would be desirable.

SUMMARY

An inverter includes: a PMOS comprising: a p-type source region, a p-type drain region, a p-channel region between the p-type source region and the p-type drain region, and a PMOS metal gate region; a NMOS, comprising: an n-type source region, an n-type drain region, an n-channel region between the n-type source region and the n-type drain region, and a NMOS metal gate region; an insulating layer above the p-channel region and the n-channel region, wherein the PMOS metal gate region and the NMOS metal gate region are above the insulating layer; and a gate contact between the NMOS metal gate region and the PMOS metal gate region.

Optionally, the PMOS metal gate region comprises: one or more PMOS work function layers located above the insulating layer; and a PMOS metal gate layer located above the one or more PMOS work function layers.

Optionally, the PMOS metal gate region further comprises a PMOS barrier layer between the one or more PMOS work function layers and the insulating layer, wherein the PMOS barrier layer surrounds the one or more PMOS work function layers and the PMOS metal gate layer Optionally, the NMOS metal gate region comprises: one or more NMOS work function layers located above the insulating layer; and a NMOS metal gate layer located above the one or more NMOS work function layers.

Optionally, the NMOS metal gate region further comprises a NMOS barrier layer between the one or more NMOS work function layers and the insulating layer, wherein the NMOS barrier layer surrounds the one or more NMOS work function layers and the NMOS metal gate layer Optionally, the gate contact is in contact with the one or more PMOS work function layers, the PMOS metal gate layer, the one or more NMOS work function layers, and the NMOS metal gate layer.

Optionally, the gate contact is in contact with the NMOS barrier layer and the PMOS barrier layer.

Optionally, the gate contact prevents cross diffusion between the PMOS metal gate region and the NMOS metal gate region.

Optionally, the gate contact has a width and a depth to allow that the gate to prevent cross diffusion between the PMOS metal gate region into the NMOS metal gate region.

Optionally, the gate contact comprises Tungsten (W).

A method for fabricating a metal gate structure for an inverter includes: forming an insulating layer on top of a p-channel region of a PMOS of the inverter and an n-channel region of a NMOS of the inverter; forming a PMOS metal gate region above the p-channel region; forming a NMOS metal gate region above the n-channel region; forming a gate contact, wherein the gate contact is between the NMOS metal gate region and the PMOS metal gate region.

Optionally, the act of forming the PMOS metal gate region comprises: forming a PMOS barrier layer above the insulating layer; forming one or more PMOS work function layers above the PMOS barrier layer; and forming a PMOS metal gate layer above the one or more PMOS work function layers.

Optionally, the PMOS barrier layer surrounds the one or more PMOS work function layers and the PMOS metal gate layer.

Optionally, the act of forming the NMOS metal gate region comprises: forming a NMOS barrier layer above the insulating layer; forming one or more NMOS work function layers above the NMOS barrier layer; and forming a NMOS metal gate layer above the one or more NMOS work function layers.

Optionally, the NMOS barrier layer surrounds the one or more NMOS work function layers and the NMOS metal gate layer.

Optionally, the gate contact is in contact with the one or more PMOS work function layers, the PMOS metal gate layer, the one or more NMOS work function layers, and the NMOS metal gate layer.

Optionally, the gate contact is in contact with the NMOS barrier layer and the PMOS barrier layer.

Optionally, the gate contact is formed to have a width and depth to allow the gate contact to prevent cross diffusion between the PMOS metal gate region and the NMOS metal gate region.

Optionally, the gate contact is formed using Tungsten (W).

Other features and details will be described in the detailed description.

BRIEF DESCRIPTION OF THE DRAWINGS

The drawings illustrate the design and utility of various features described herein, in which similar elements are referred to by common reference numerals. These drawings are not necessarily drawn to scale. In order to better appreciate how the above-recited and other advantages and objects are obtained, a more particular description will be rendered, which are illustrated in the accompanying drawings. These drawings depict only exemplary features and are not therefore to be considered limiting in the scope of the claims.

FIGS. 7-1 to 7-8 are cross-sectional view schematic diagrams illustrating a method for fabricating a metal gate structure for an inverter.

DETAILED DESCRIPTION

Figure 1:
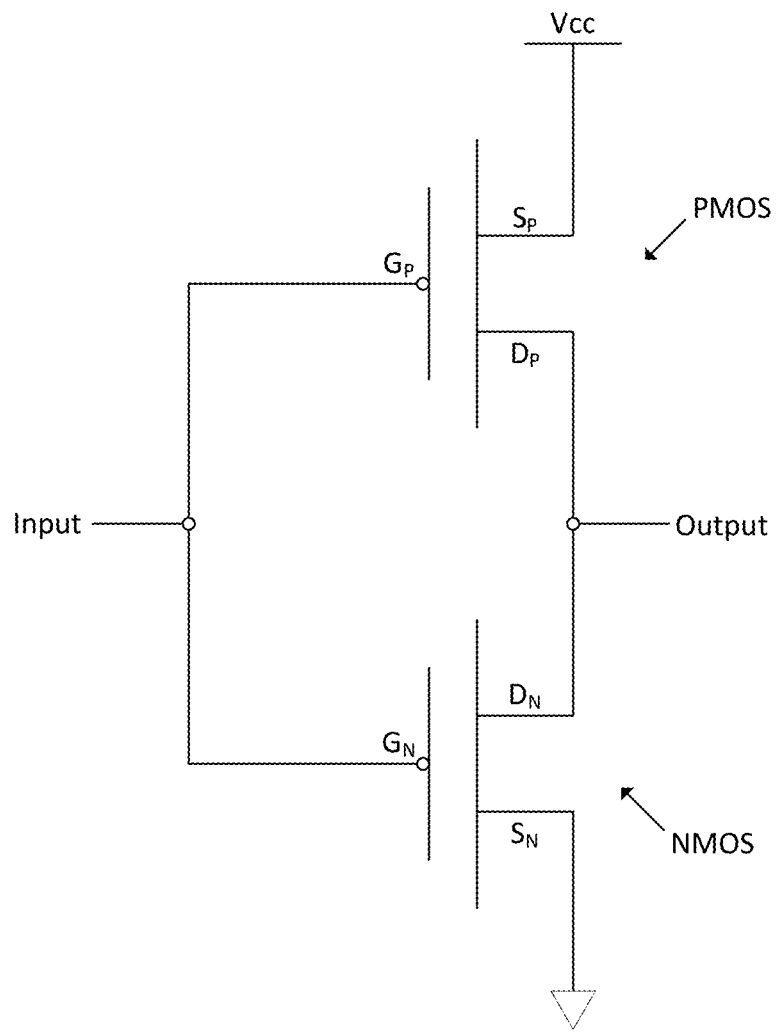
FIG. 1 is a circuit diagram of an exemplary inverter.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiments even if not so illustrated, or if not so explicitly described.

In accordance with some embodiments, an inverter includes a PMOS and a NMOS. The PMOS comprises a p-type source region, a p-type drain region, a p-channel region between the p-type source region and the p-type drain region, and a PMOS metal gate region. The NMOS comprises an n-type source region, an n-type drain region, an n-channel region between the n-type source region and the n-type drain region, and a NMOS metal gate region. The inverter further includes an insulating layer above the p-channel region and the n-channel region, wherein the PMOS metal gate region and the NMOS metal gate region are above the insulating layer. The inverter further includes a gate contact between the NMOS metal gate region and the PMOS metal gate region. The gate contact may be configured to prevent diffusion from the PMOS metal gate region into the NMOS metal gate region. Alternatively, or additionally, the gate contact may be configured to prevent diffusion from the NMOS metal gate region into the PMOS metal gate region. The gate contact may be configured into various shapes and sizes depending on the particular application. By placing the gate contact between the PMOS metal gate region and the NMOS metal gate region, cross-diffusion between the PMOS metal gate region and NMOS metal gate region may be prevented. This may be accomplished without having to increase layout size of the inverter. This may also be accomplished without having to increase the thickness of a NMOS barrier layer and a PMOS barrier layer, thereby allowing for subsequent fabrication of work function layers and metal gate layers within the same layout area without additional complexities.

An inverter includes a p-type MOSFET transistor (PMOS) coupled with an n-type MOSFET transistor (NMOS). FIG. 1 is a circuit diagram illustrating an exemplary inverter 100. The inverter includes a PMOS having a source $S_P$, drain $D_P$ and gate $G_P$ and a NMOS having a source $S_N$, drain $D_N$ and gate $G_N$. An input is coupled to the gate $G_P$ of the PMOS as well as the gate $G_N$ of the NMOS. An output is coupled to the drain $D_P$ of the PMOS and the drain $D_N$ of the NMOS. The source $S_P$ of the PMOS is coupled to a supply voltage Vcc and the source $S_N$ of the NMOS is coupled to ground.

Figure 2:
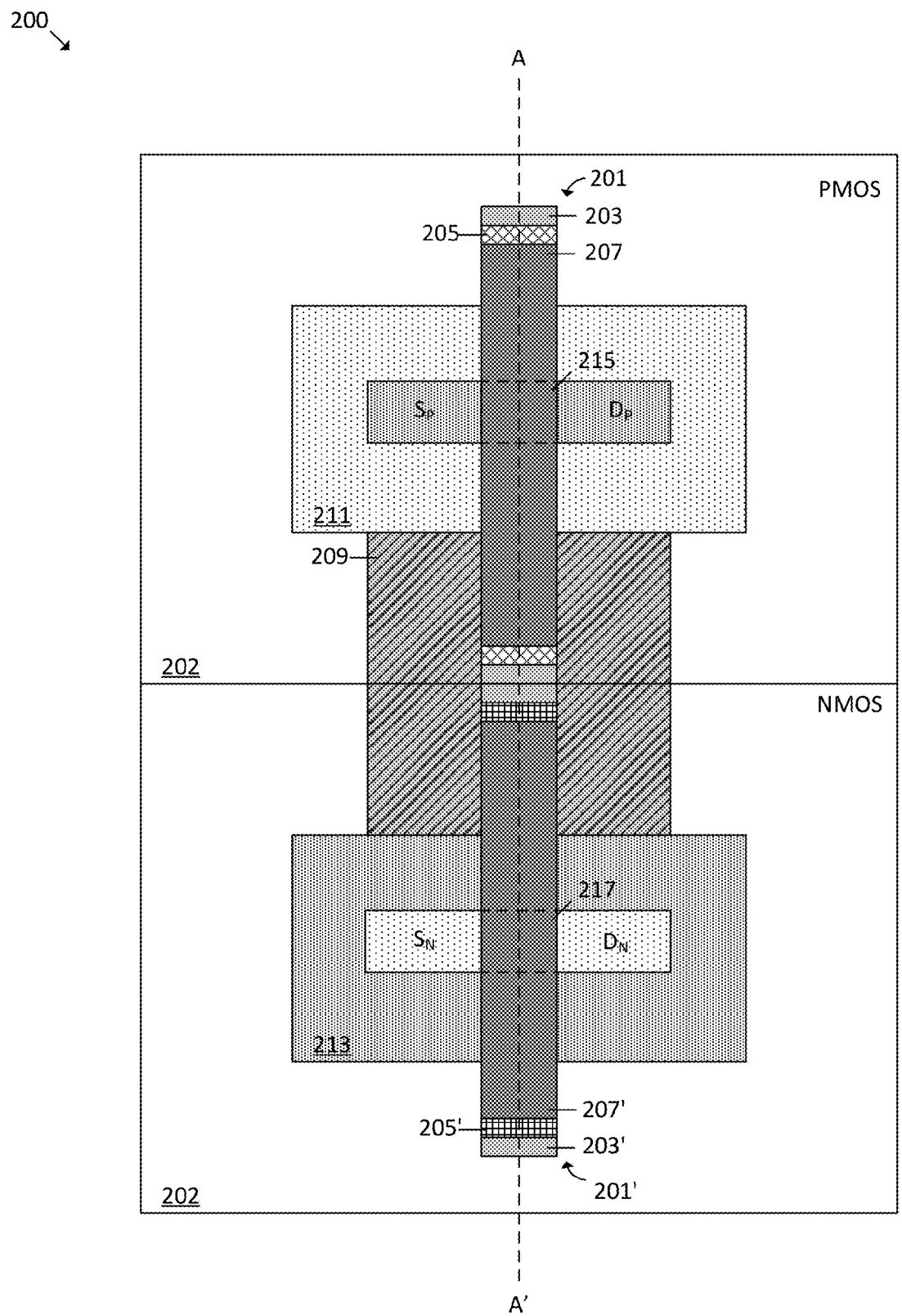
FIG. 2 is a top-view layout diagram of an exemplary inverter.

FIG. 2 is a top-view layout diagram of an inverter. The inverter includes a PMOS and a NMOS, which may both be formed within the same substrate 202. The PMOS includes a source region $S_P$, a drain region $D_P$, and a p-channel region 215 depicted by the dashed box located between the source region $S_P$ and the drain region $D_P$. The source region $S_P$ and drain region $D_P$ may be formed within an n-well 211. The p-channel region 215 becomes present within the n-well 211 between the source region $S_P$ and drain region $D_P$ when an appropriate voltage is applied to the PMOS.

The PMOS also includes a PMOS metal gate region 201 that includes a PMOS barrier layer 203, one or more PMOS work function layers 205, and a PMOS metal gate layer 207. The PMOS metal gate region 201 is located above an insulating layer (not shown) that is situated between the PMOS metal gate region 201 and the p-channel region 215. The insulating layer may be shared between the PMOS and the NMOS. Although the PMOS depicted in FIG. 2 includes only a single work function layer 205, it is important to note that various configurations of work function layers 205 may be used to implement the PMOS metal gate region 201.

The NMOS includes a source region $S_N$, a drain region $D_N$, and an n-channel region 217 depicted by the dashed box located between the source region $S_N$ and the drain region $D_N$. The source region $S_N$ and drain region $D_N$ may be formed within an p-well 213. The n-channel region 217 becomes present within the p-well 213 between the source region $S_N$ and drain region $D_N$ when an appropriate voltage is applied to the NMOS.

The NMOS also includes a NMOS metal gate region 201' that includes a NMOS barrier layer 203', one or more NMOS work function layers 205', and a NMOS metal gate layer 207'. The NMOS metal gate region 201' is located above an insulating layer (not shown) that is situated between the NMOS metal gate region 201' and the n-channel region 217. The insulating layer may be shared between the PMOS and the NMOS. Although the NMOS depicted in FIG. 2 includes only a single work function layer 205', it is important to note that various configurations of work function layers 205' may be used to implement the NMOS metal gate region 201'.

An insulation region 209 may be formed between the p-channel region 215 and the n-channel region 217 to separate the p-channel region 215 from the n-channel region 217 during operation.

Figure 3:
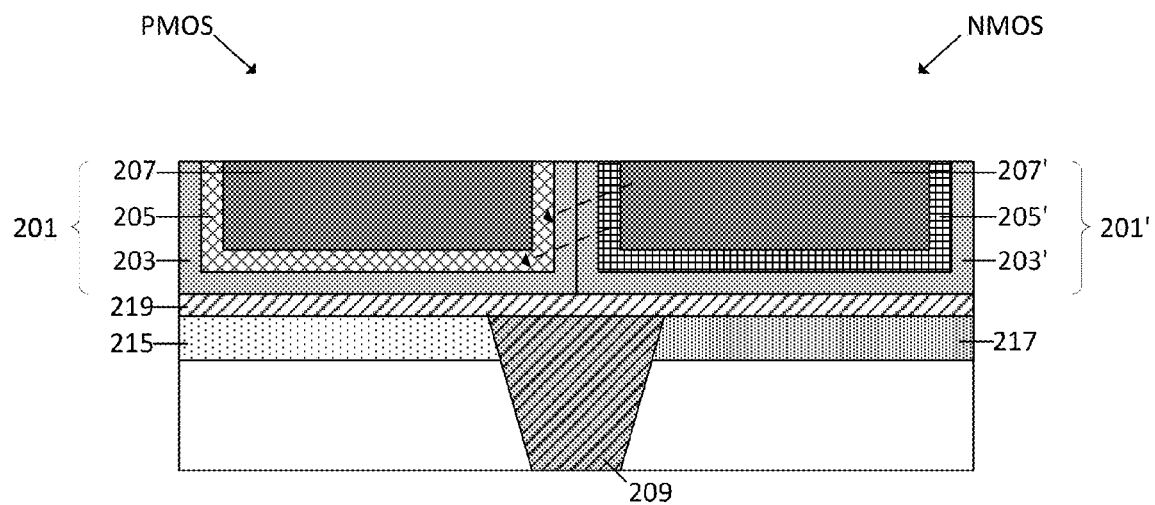
FIG. 3 is a cross-sectional view layout diagram across the plane A-A' of the exemplary inverter of FIG. 2.

A cross-sectional view layout diagram across the plane formed by the line A-A' in FIG. 2 is now illustrated in FIG. 3.

While the top-view layout diagram of the inverter 200 in FIG. 2 does not illustrate the insulating layer situated between the NMOS/PMOS metal gate region 201, 201' and the n-channel region 215 and p-channel region 217, the cross-sectional view layout diagram of FIG. 3 does illustrate the insulating layer as element 219. While FIG. 3 depicts the insulating layer 219 as a single layer, it is important to note that the insulating layer 219 may comprise multiple layers. For example, in some embodiments, the insulating layer 219 may comprise both an oxide layer and an HiK layer above the oxide layer.

The cross-sectional view layout diagram of the inverter 200 in FIG. 3 illustrates the barrier layer 203, 203' surrounding the work function layers 205, 205' and metal gate layers 207, 207' for both the PMOS and the NMOS. Similarly, the cross-sectional view layout diagram of the inverter 200 in FIG. 3 illustrates the work function layers 205, 205' surrounding the metal gate layers 207, 207' for both the PMOS and the NMOS. However, it is important to note that the PMOS and NMOS may be configured without a barrier layer 203, 203', or with work function layers 205, 205' located below the metal gate layers 207, 207' and not surrounding the metal gate layers 207, 207'.

Regardless of the configuration of the PMOS metal gate region 201 or NMOS metal gate region 201', the close proximity between the PMOS metal gate region 201 and NMOS metal gate region 201' leads to cross-diffusion between the metal gate layers 207, 207' and work function layers 205, 205' of the PMOS metal gate region 201 and NMOS metal gate region 201'.

FIG. 3 depicts diffusion occurring from the metal gate layer 207' and work function layers 205' of the NMOS into the work function layers 205 of the PMOS. Such diffusion is depicted by the dashed arrows pointing from the metal gate layer 207' and work function layers 205' of the NMOS to the work function layers 205 of the PMOS. However, in other embodiments, diffusion may occur in a direction from the metal gate layer 207 and work function layers 205 of the PMOS into the work function layers 205' of the NMOS.

Diffusion from the metal gate region 201' of the NMOS into the metal gate region 201 of the PMOS, or vice versa results in a shift in threshold voltage associated with the NMOS or the PMOS. Such shifts in threshold voltage may result in degradation of device performance and increases in device variation, both of which are undesirable.

One approach for reducing cross-diffusion between the metal gate regions of the NMOS and PMOS is to increase the distance between the metal gate regions of the NMOS and PMOS. However, such an approach leads to increased layout area, which may be undesirable or impermissible when fabricating small integrated devices.

Another approach for reducing cross-diffusion between the metal gate regions of the NMOS and PMOS is to increase the thickness of the NMOS barrier layer and PMOS barrier layer. However, such an approach leads to difficulties in subsequently fabricating the work function layers and metal gate layer within the same layout area.

Figure 4:
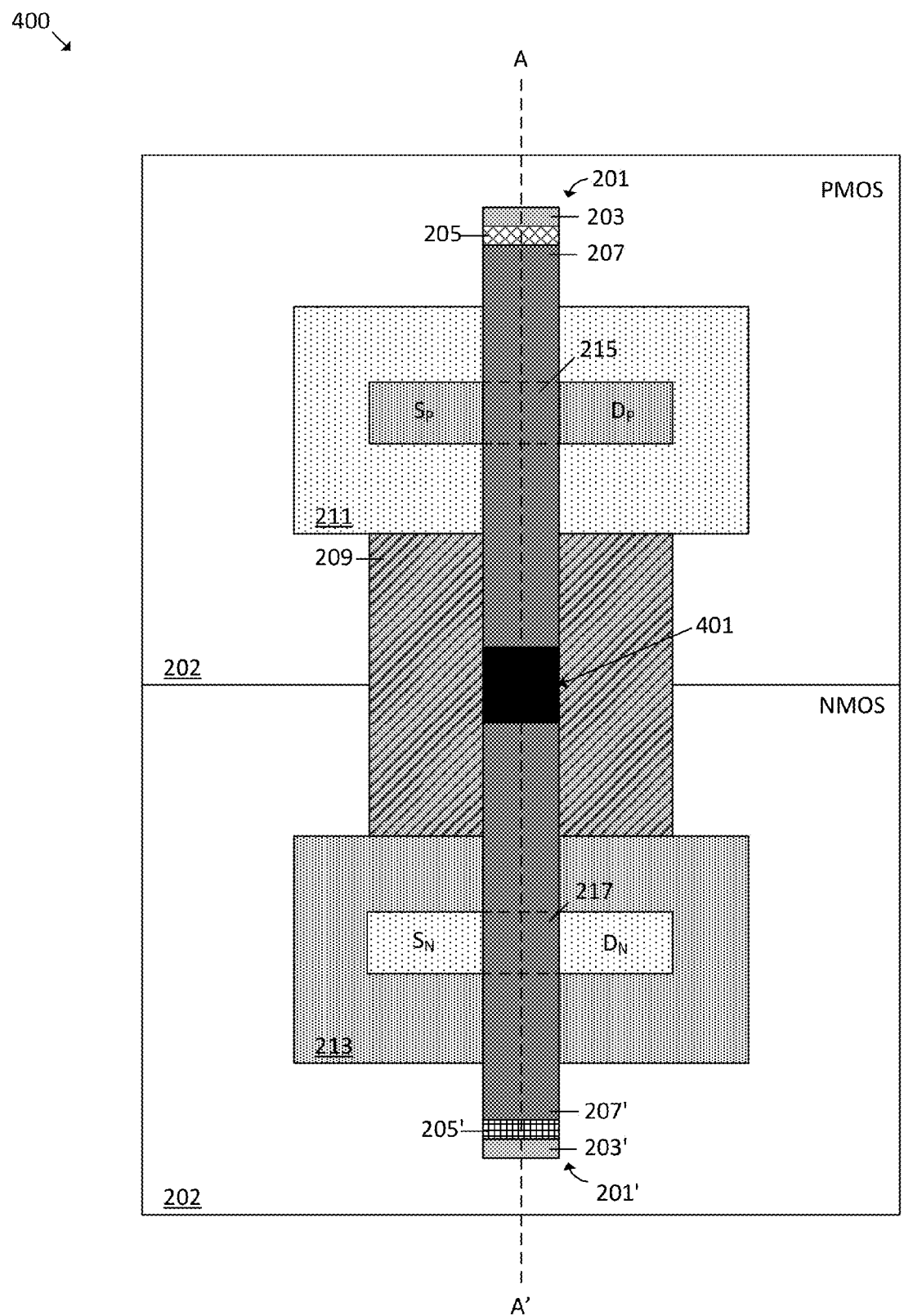
FIG. 4 is a top-view schematic diagram of an inverter.
Figure 5:
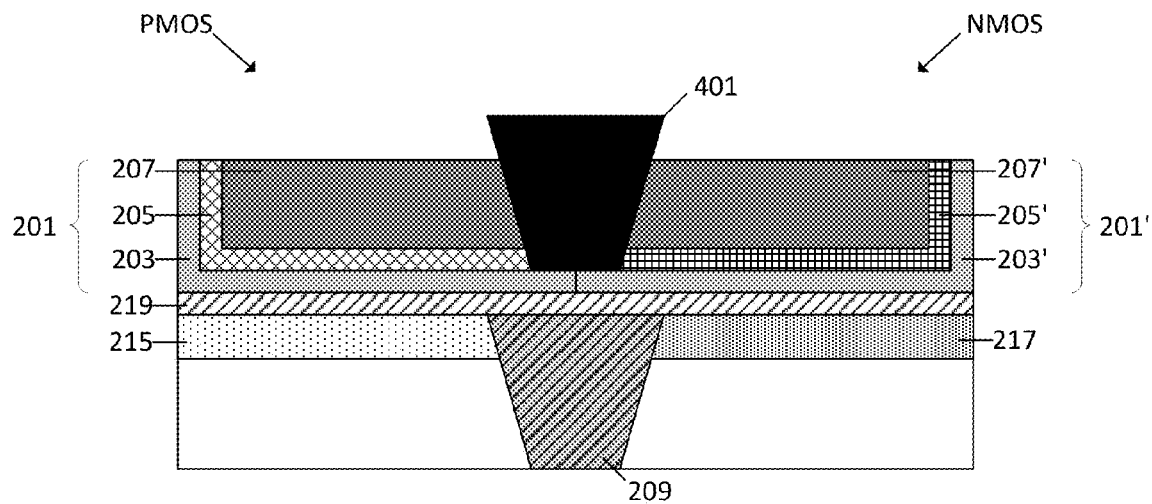
FIG. 5 is a cross-sectional view schematic diagram across the plane A-A' of the inverter of FIG. 4.

FIG. 4 is a top-view schematic diagram of another inverter. FIG. 5 is a cross-sectional view schematic diagram of the inverter in FIG. 4. The following description should be read in conjunction with both FIG. 4 and FIG. 5. The inverter 400 of FIGS. 4 and 5 is similar to the inverter 200 of FIG. 2, except for the addition of a gate contact 401. As such, for purposes of simplicity, elements of the inverter 400 that were previously described in FIG. 2 will not be described again in detail.

As mentioned above and as illustrated in FIG. 1, an input to the inverter is coupled to both the gate $G_N$ of the NMOS and the gate $G_P$ of the PMOS. The gate contact 401 in FIGS. 4 and 5 represents such an input. In FIGS. 4 and 5, the gate contact 401 is coupled to both the metal gate region 201' of the NMOS and the metal gate region 201 of the PMOS. The gate contact 401 is situated such that when a voltage is applied to the gate contact 401, the voltage is coupled to both the metal gate region 201 of the PMOS as well as the metal gate region 201' of the NMOS.

The gate contact 401 is situated in (or in contact with) the PMOS metal gate region 201 and the NMOS metal gate region 201' at a boundary between the PMOS metal gate region 201 and NMOS metal gate region 201'. In some embodiments, the gate contact 401 may be situated in the PMOS metal gate layer 207, the PMOS work function layers 205, the NMOS metal gate layer 207' and the NMOS work function layers 205' as depicted in FIG. 5. In some embodiments, the gate contact 401 may be situated such that it is in contact with the NMOS barrier layer 203' and PMOS barrier layer 203. In other embodiments, the gate contact 401 may be situated only partially in the NMOS work function layers 205' and PMOS work function layers 205, such that it is not in direct contact with the NMOS barrier layer 203' or PMOS barrier layer 203.

The gate contact 401 may be configured to have a width and depth sufficient to prevent diffusion from the PMOS metal gate region 201 into the NMOS metal gate region 201'. Alternatively, the gate contact 401 may be configured to have a width and depth sufficient to prevent diffusion from the NMOS metal gate region 201' into the PMOS metal gate region 201. The gate contact 401 may be configured into various shapes and sizes depending on the particular application.

By placing a gate contact 401 at a boundary between the PMOS metal gate region 201 and NMOS metal gate region 201', cross-diffusion between the PMOS metal gate region 201 and NMOS metal gate region 201' may be prevented. This may be accomplished without having to increase layout size of the inverter 400. This may also be accomplished without having to increase the thickness of the NMOS barrier layer and PMOS barrier layer, thereby allowing for subsequent fabrication of work function layers and metal gate layers within the same layout area without additional complexities.

The insulating layer 219 may have different sizes in different embodiments. For example, in some embodiments, the insulating layer 219 may have a thickness that is anywhere from 20 Å to 40 Å, such as about 28 Å (e.g., 28 Å±3 Å). In other embodiments, the insulating layer 219 may have a thickness that is more than 40 Å. In further embodiments, the insulating layer 219 may have a thickness that is less than about 20 Å.

The barrier layer 203/203' may have different sizes in different embodiments. For example, in some embodiments, the barrier layer 203/203' may have a thickness that is anywhere from 10 Å to 20 Å, such as about 12 Å (e.g., 12 Å±1 Å). In other embodiments, the barrier layer 203/203' may have a thickness that is more than 20 Å. In further embodiments, the barrier layer 203/203' may have a thickness that is less than 10 Å.

The work function layer 205/205' may have different sizes in different embodiments. For example, in some embodiments, the work function layer 205/205' may have a thickness that is anywhere from 10 Å to 30 Å, such as about 20 Å (e.g., 20 Å±2 Å). In other embodiments, the work function layer 205/205' may have a thickness that is more than 30 Å. In further embodiments, the work function layer 205/205' may have a thickness that is less than 10 Å.

The metal gate layer 207/207' may have different sizes in different embodiments. For example, in some embodiments, the metal gate layer 207/207' may have a thickness that is anywhere from 400 A to 500 A, such as about 480 A (e.g., 480 A±50 A). In other embodiments, the metal gate layer 207/207' may have a thickness that is more than 500 A. In further embodiments, the metal gate layer 207/207' may have a thickness that is less than 400 A.

Figure 6:
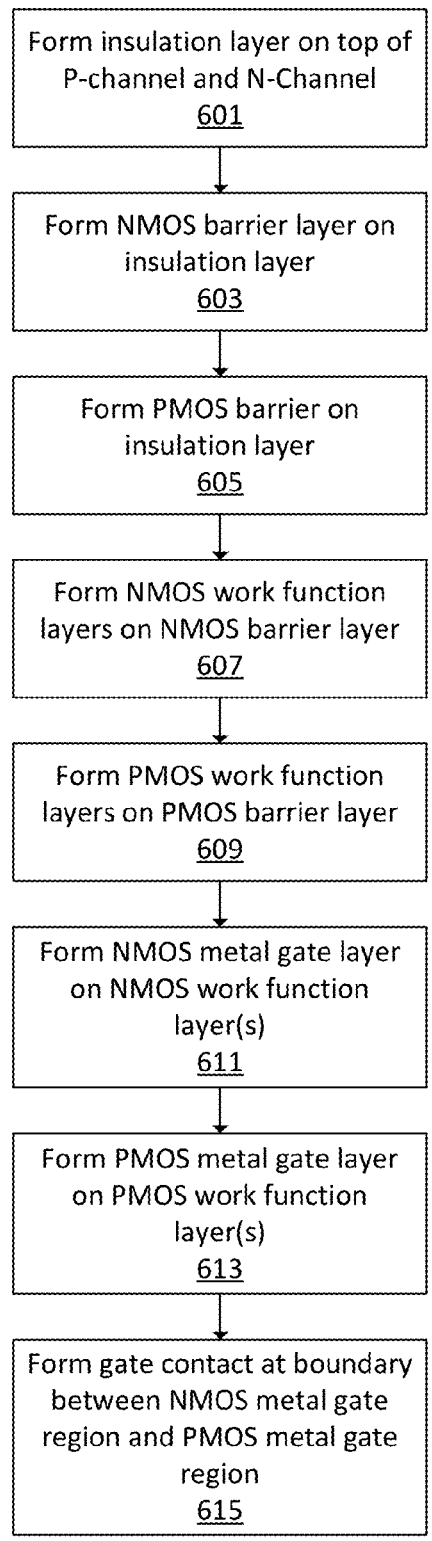
FIG. 6 is a flow diagram illustrating a method for fabricating a metal gate structure for an inverter.

FIG. 6 is a flow diagram illustrating a method for fabricating a metal gate structure for an inverter. The method for fabricating the metal gate structure for the inverter will be described starting from a point in time after formation of a source/drain region and channel region for the PMOS and NMOS of the inverter. One ordinarily skilled in the art will recognize that numerous mechanisms exist for forming source/drain regions and channel regions for a PMOS and NMOS of an inverter, and the following description for fabricating the metal gate structure for the inverter is not limited to any particular one of those mechanisms.

Initially an insulating layer is formed on top of a p-channel region of the PMOS of the inverter and an N-channel region of the NMOS of the inverter as shown at 601. In some embodiments, the insulating layer may be formed in a single process step. In other embodiments, the insulating layer may be formed in more than one process step. In some embodiments, the insulating layer may include both an oxide layer and a HiK layer formed above the oxide layer. Any number of different deposition and lithography techniques may be used to form the insulating layer on top of the p-channel region and n-channel regions of the inverter.

A NMOS barrier layer may then be optionally formed on the insulating layer as shown at 603. For some applications, a NMOS barrier layer is not used for fabricating the metal gate structure for the inverter. In some embodiments, the NMOS barrier layer may be composed of Tantalum Nitride (TaN). Again, any number of different deposition and lithography techniques may be used to form the barrier layer.

A PMOS barrier layer may then be optionally formed on the insulating layer as shown at 605. For some applications, a PMOS barrier layer is not used for fabricating the metal gate structure for the inverter. In some embodiments, the PMOS barrier layer may be composed of a Tantalum (Ta) based material. Again, any number of different deposition and lithography techniques may be used to form the PMOS barrier layer.

One or more NMOS work function layers may then be formed on the NMOS barrier layer as shown at 607. The NMOS work function layers may have various different numbers of work function layers depending on the particular application. In some embodiments, the NMOS work function layers may be composed of Titanium Aluminum Nitride (TiAlN). The configuration (e.g., composition) of the NMOS work function layers determines the threshold voltage of the NMOS in the inverter.

In some embodiments, the one or more NMOS work function layers may be formed within the NMOS barrier layer such that the NMOS barrier layer surrounds the NMOS work function layers. The NMOS work function layers may be consecutively formed within one another such that the outermost NMOS work function layer surrounds all of the other NMOS work function layers, and each subsequently formed work function layer surrounds any other NMOS work function layers formed after it.

In other embodiments, the NMOS work function layer may be formed on top of the NMOS barrier layer such that the NMOS barrier layer does not surround the NMOS work function layers. Still, in other embodiments where the NMOS barrier layer is not formed, the NMOS work function layers may be formed on the insulating layer.

One or more PMOS work function layers may then be formed on the PMOS barrier layer as shown at 609. The PMOS work function layers may have various different numbers of work function layers depending on the particular application. In some embodiments, the NMOS work function layers may be composed of Titanium Nitride (TiN). The configuration (e.g., composition) of the PMOS work function layers determines the threshold voltage of the PMOS in the inverter.

In some embodiments, the one or more PMOS work function layers may be formed within the PMOS barrier layer such that the PMOS barrier layer surrounds the PMOS work function layers. The PMOS work function layers may be consecutively formed within one another such that the outermost PMOS work function layer surrounds all of the other PMOS work function layers, and each subsequently formed work function layer surrounds any other PMOS work function layers formed after it.

In other embodiments, the PMOS work function layer may be formed on top of the PMOS barrier layer such that the PMOS barrier layer does not surround the PMOS work function layers. Still, in other embodiments where the PMOS barrier layer is not formed, the PMOS work function layers may be formed on the insulating layer.

A NMOS metal gate layer may then be formed on the NMOS work function layer(s) as shown at 611. Together the NMOS metal gate layer, the NMOS work function layers, and optionally the NMOS barrier layer form the NMOS metal gate region. In some embodiments, the NMOS metal gate layer is formed within the NMOS work function layer(s), such that the NMOS work function layer(s) surround the NMOS metal gate layer. In other embodiments, the NMOS metal gate layer is formed on top of the NMOS work function layer(s), such that the NMOS work function layer(s) do not surround the NMOS metal gate layer.

A PMOS metal gate layer may then be formed on the PMOS work function layer(s) as shown at 613. Together the PMOS metal gate layer, the PMOS work function layers, and optionally the PMOS barrier layer form the PMOS metal gate region. In some embodiments, the PMOS metal gate layer is formed within the PMOS work function layer(s), such that the PMOS work function layer(s) surround the PMOS metal gate layer. In other embodiments, the PMOS metal gate layer is formed on top of the PMOS work function layer(s), such that the PMOS work function layer(s) do not surround the PMOS metal gate layer.

Fabrication of the NMOS metal gate region (e.g., NMOS metal gate layer, NMOS work function layers, and NMOS barrier layer) and the PMOS metal gate region (e.g., PMOS metal gate layer, PMOS work function layer, and PMOS barrier layer) results in the NMOS metal gate region and PMOS metal gate region being in close proximity to each other. As discussed above, their close proximity results in cross-diffusion that leads to shifts in threshold voltages.

However, by forming a gate contact at a boundary between the NMOS metal gate region and the PMOS metal gate region as shown at 615, such cross-diffusion may be prevented. The gate contact may be situated such that when a voltage is applied to the gate contact, the voltage is coupled to both the PMOS metal gate region as well as the NMOS metal gate region.

In some embodiments, the gate contact may be situated within the PMOS metal gate layer, the PMOS work function layers, the NMOS metal gate layer and the NMOS work function layers as depicted in FIG. 5. In some embodiments, the gate contact may be situated such that it is in contact with the NMOS barrier layer and PMOS barrier layer. In other embodiments, the gate contact may be situated only partially in the NMOS work function layers and PMOS work function layers, such that it is not in direct contact with the NMOS barrier layer or PMOS barrier layer.

The gate contact may be configured to have a width and depth sufficient to prevent diffusion from the PMOS metal gate region into the NMOS metal gate region. The gate contact may be configured into various shapes and sizes depending on the particular application.

Figures 1, 7:
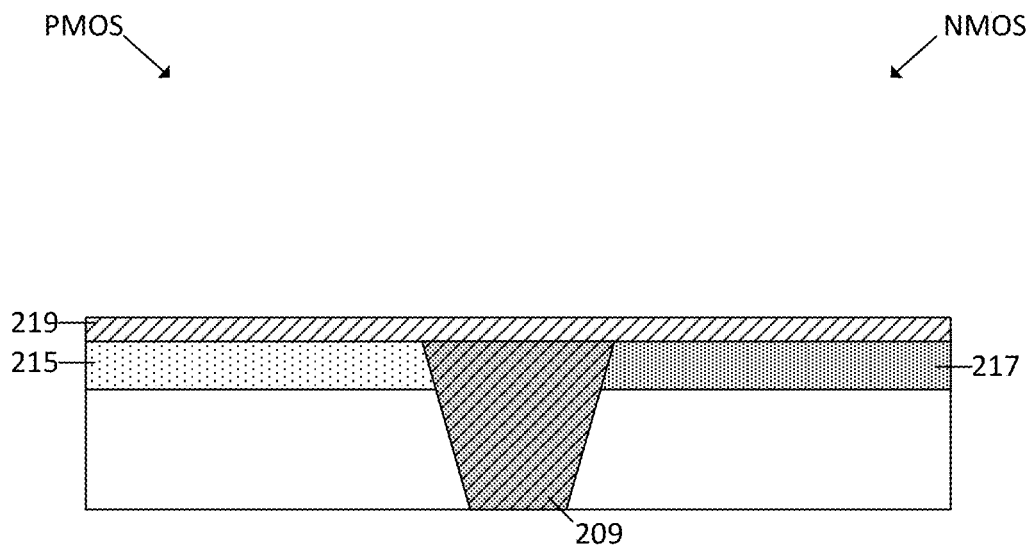
Figures 2, 7:
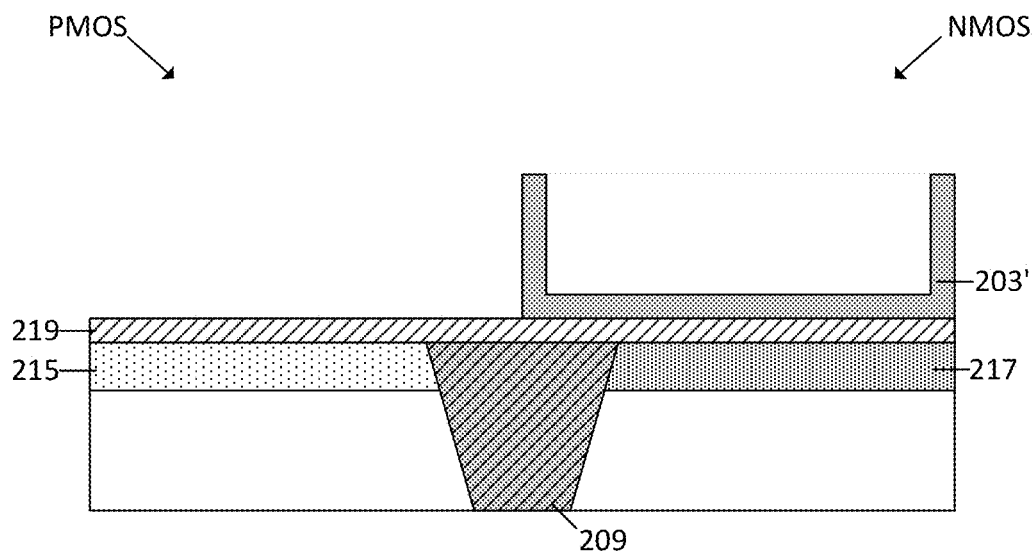
Figures 3, 7:
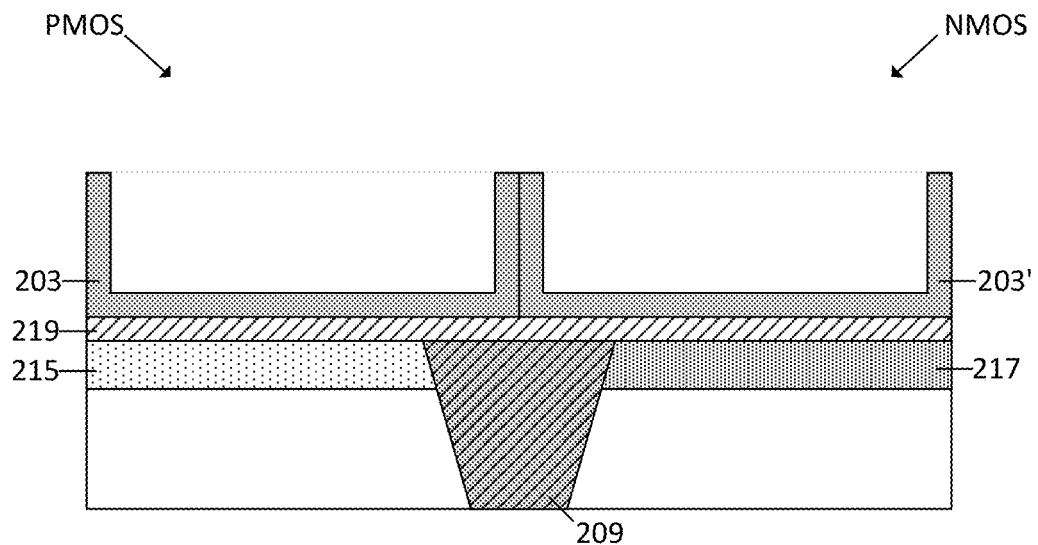
Figures 4, 7:
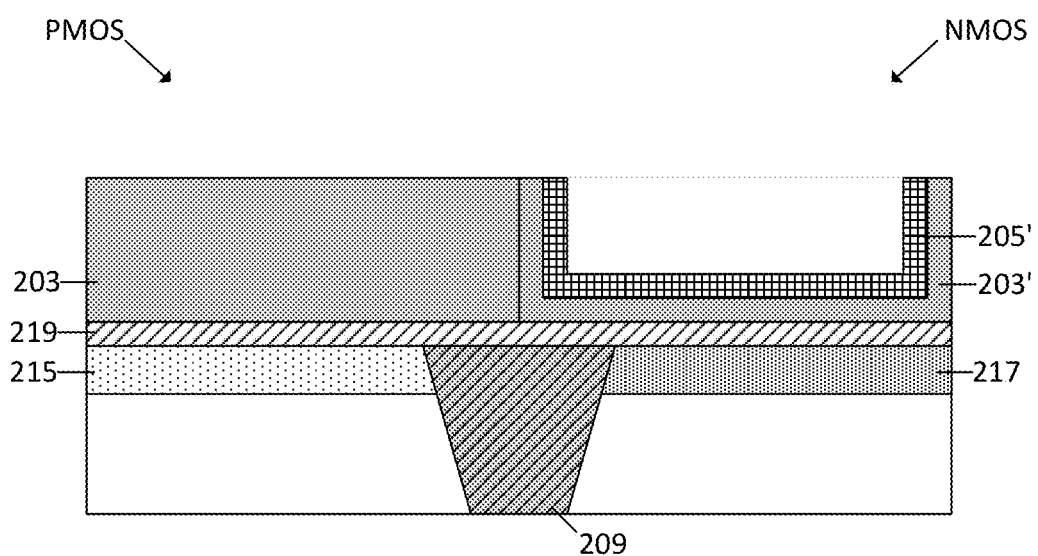
Figures 5, 7:
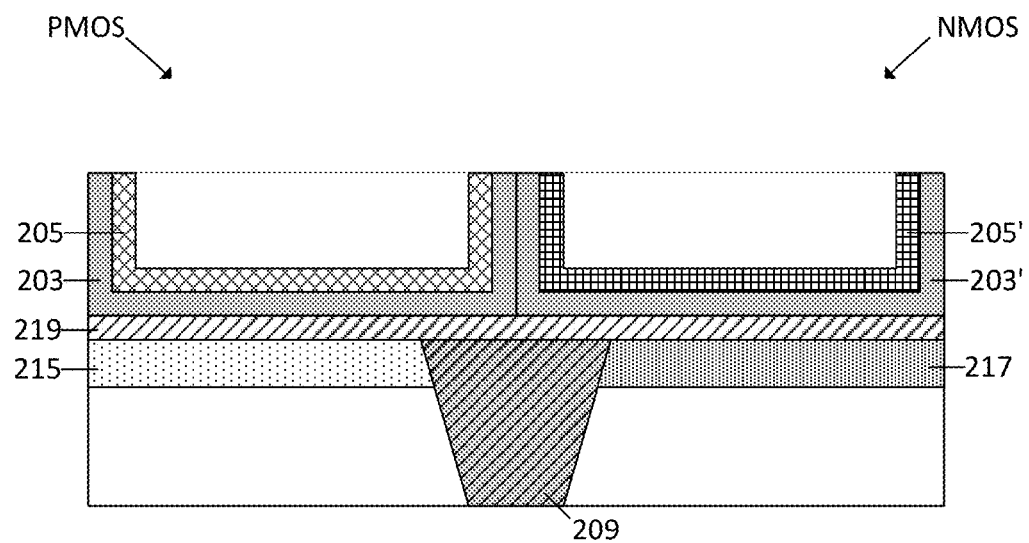
Figures 6, 7:
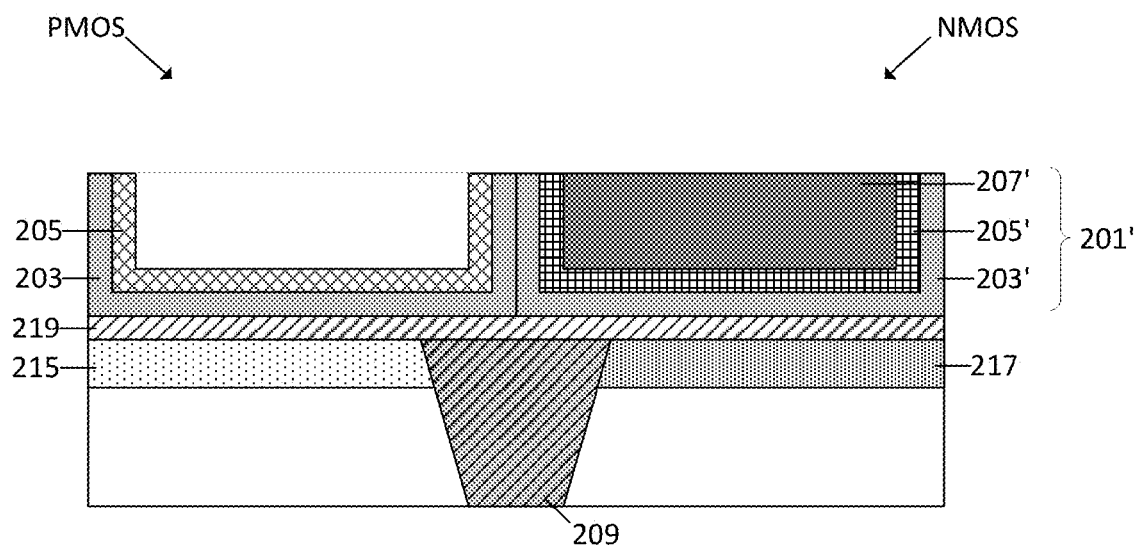
Figure 7:
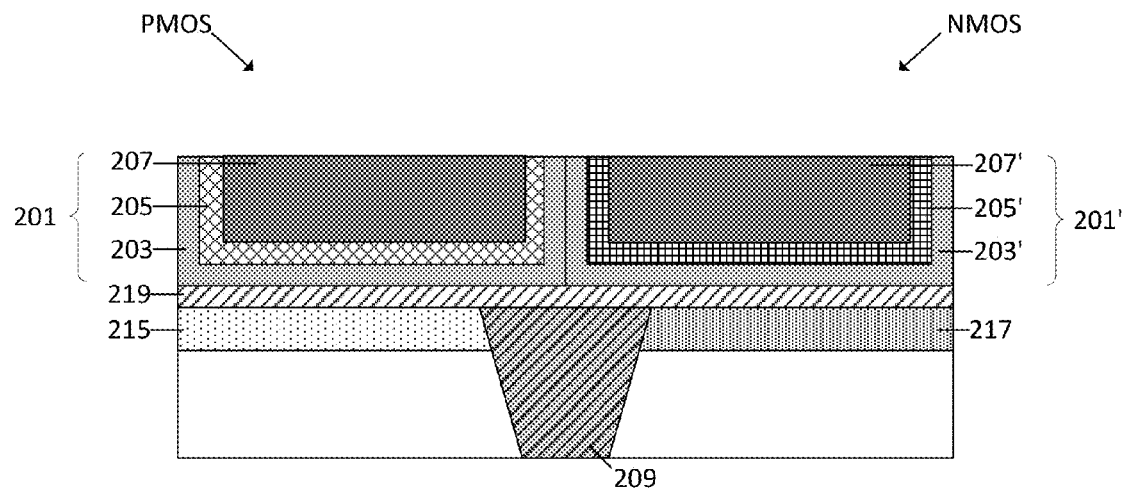
Figures 7, 8:
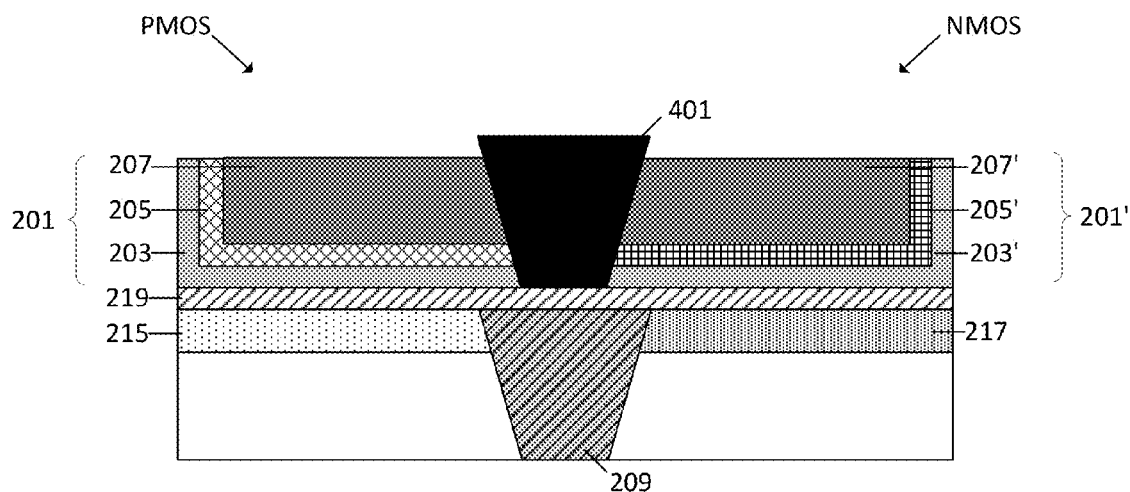

FIGS. 7-1 to 7-8 are cross-sectional view schematic diagrams illustrating the method for fabricating a metal gate structure for an inverter depicted in FIG. 6.

Similar to the method described in FIG. 6, the method for fabricating the metal gate structure for the inverter illustrated in FIGS. 7-1 to 7-8 will be described starting from a point in time after formation of a source/drain region and channel region for the PMOS and NMOS of the inverter.

Initially an insulating layer 219 is formed on top of a p-channel region 215 of the PMOS of the inverter and an N-channel region 217 of the NMOS of the inverter as shown in FIG. 7-1. In some embodiments, the insulating layer 219 may include an oxide layer and an HiK layer formed on top of the oxide layer. The p-channel region 215 and n-channel region 217 may be separated by an insulation region 209. In some embodiments, the insulating layer 219 may be formed in a single process step. Any number of different deposition and lithography techniques may be used to form the insulating layer 219 on top of the p-channel region 215 and n-channel regions 217 of the inverter.

A NMOS barrier layer 203' may then formed on the insulating layer 219 as shown in FIG. 7-2. In some embodiments, the NMOS barrier layer 203' may be composed of Tantalum Nitride (TaN). Again, any number of different deposition and lithography techniques may be used to form the NMOS barrier layer 203'.

A PMOS barrier layer 203 may then be formed on the insulating layer 219 as shown in FIG. 7-3. In some embodiments, the PMOS barrier layer 203 may be composed of Tantalum (Ta) based material. Again, any number of different deposition and lithography techniques may be used to form the PMOS barrier layer 203.

A NMOS work function layer 205' may then be formed on the NMOS barrier layer 203' as shown in FIG. 7-4. Although FIG. 7-4 depicts only a single NMOS work function layer 205' being formed, various different numbers of NMOS work function layers 205' may be formed depending on the particular application. In some embodiments, the NMOS work function layers 205' may be composed of Titanium Aluminum Nitride (TiAlN). The configuration (e.g., composition) of the NMOS work function layer 205' determines the threshold voltage of the NMOS in the inverter.

In FIG. 7-4, the NMOS work function layer is 205' formed within the NMOS barrier layer 203' such that the NMOS barrier layer 203' surrounds the NMOS work function layer 205'.

A PMOS work function layer 205 may then be formed on the PMOS barrier layer 203 as shown in FIG. 7-5. Although FIG. 7-5 depicts only a single PMOS work function layer 203 being formed, various different numbers of PMOS work function layers 203 may be formed depending on the particular application. In some embodiments, the PMOS work function layers 205 may be composed of Titanium Nitride (TiN). The configuration (e.g., composition) of the PMOS work function layer 205 determines the threshold voltage of the PMOS in the inverter.

In FIG. 7-5, the PMOS work function layer is 205 formed within the PMOS barrier layer 203 such that the PMOS barrier layer 203 surrounds the PMOS work function layer 205.

A NMOS metal gate layer 207' is then formed on the NMOS work function layer 205' as shown in FIG. 7-6. Together the NMOS metal gate layer 207', the NMOS work function layer 205', and the NMOS barrier layer 203' form the NMOS metal gate region 201'. In FIG. 7-6, the NMOS metal gate layer 207' is formed within the NMOS work function layer 205', such that the NMOS work function layer 205' surrounds the NMOS metal gate layer 207'.

A PMOS metal gate layer 207 is then formed on the PMOS work function layer 205 as shown in FIG. 7-7. Together the PMOS metal gate layer 207, the PMOS work function layer 205, and the PMOS barrier layer 203 form the PMOS metal gate region 201. In FIG. 7-7, the PMOS metal gate layer 207 is formed within the PMOS work function layer 205, such that the PMOS work function layer 205 surrounds the PMOS metal gate layer 207.

Fabrication of the NMOS metal gate region 201' (e.g., NMOS metal gate layer 207', NMOS work function layer 205', and NMOS barrier layer 203') and the PMOS metal gate region 201 (e.g., PMOS metal gate layer 207, PMOS work function layer 205 and PMOS barrier layer 203) results in the NMOS metal gate region 201' and PMOS metal gate region 201 being in close proximity to each other. As discussed above, their close proximity results in cross-diffusion that leads to shifts in threshold voltages.

However, by forming a gate contact 401 at a boundary between the NMOS metal gate region 201' and the PMOS metal gate region 201 as shown in FIG. 7-8, such cross-diffusion may be prevented. In FIG. 7-8, the gate contact 401 is situated such that when a voltage is applied to the gate contact 401, the voltage is coupled to both the PMOS metal gate region 201 as well as the NMOS metal gate region 201'.

The gate contact is situated in (or is in contact with) the PMOS metal gate layer 207, the PMOS work function layer 205, the NMOS metal gate layer 207' and the NMOS work function layer 205' as depicted in FIG. 7-8. In FIG. 7-8, the gate contact 401 is situated such that it is in contact with the NMOS barrier layer 203' and PMOS barrier layer 203. The gate contact 401 is configured to have a width and depth sufficient to prevent diffusion from the PMOS metal gate region 201 into the NMOS metal gate region 201'.

By placing a gate contact 401 at a boundary between the PMOS metal gate region 201 and NMOS metal gate region 201', cross-diffusion between the PMOS metal gate region 201 and NMOS metal gate region 201' may be prevented. This may be accomplished without having to increase layout size of the inverter 400. This may also be accomplished without having to increase the thickness of the NMOS barrier layer 203' and PMOS barrier layer 203, thereby allowing for subsequent fabrication of work function layers and metal gate layers within the same layout area without additional complexities.

The above process flow of FIGS. 6 and 7-1 to 7-8 is described with reference to a particular ordering of process actions. However, the ordering of the described process actions may be different in other embodiments. One ordinarily skilled in the art will recognize that various actions in the method may be performed in a different order to achieve the same result. Likewise, it is important to note that while particular techniques have been described for implementing certain process acts, one ordinarily skilled in the art will recognize that other techniques may also exist for implementing those process acts.

Although particular features have been shown and described, it will be understood that they are not intended to limit the claimed invention, and it will be made obvious to those skilled in the art that various changes and modifications may be made without departing from the spirit and scope of the claimed invention. The specification and drawings are, accordingly, to be regarded in an illustrative rather than restrictive sense. The claimed invention is intended to cover all alternatives, modifications and equivalents.

What is claimed is:

1. An inverter, comprising:
   a PMOS comprising:
   a p-type source region,
   a p-type drain region,
   a p-channel region between the p-type source region and the p-type drain region, and
   a PMOS metal gate region comprising one or more PMOS work function layers located above an insulating layer and a PMOS metal gate layer located above the one or more PMOS work function layers, the PMOS metal gate layer consisting of metal;
   a NMOS, comprising:
   an n-type source region,
   an n-type drain region,
   an n-channel region between the n-type source region and the n-type drain region, and
   a NMOS metal gate region comprising one or more NMOS work function layers located above the insulating layer and a NMOS metal gate layer located above the one or more NMOS work function layers, the NMOS metal gate layer consisting of metal;
   the insulating layer being above the p-channel region and the n-channel region, wherein the PMOS metal gate region and the NMOS metal gate region are above the insulating layer; and
   a gate contact having a frusto-conical cross-section and being disposed between the NMOS metal gate region and the PMOS metal gate region.

2. The inverter of claim 1, wherein the PMOS metal gate region further comprises a PMOS barrier layer between the one or more PMOS work function layers and the insulating layer, wherein the PMOS barrier layer surrounds the one or more PMOS work function layers and the PMOS metal gate layer.

3. The inverter of claim 1, wherein the NMOS metal gate region further comprises a NMOS barrier layer between the one or more NMOS work function layers and the insulating layer, wherein the NMOS barrier layer surrounds the one or more NMOS work function layers and the NMOS metal gate layer.

4. The inverter of claim 3, wherein the gate contact is in contact with the one or more PMOS work function layers, the PMOS metal gate layer, the one or more NMOS work function layers, and the NMOS metal gate layer.

5. The inverter of claim 3, wherein the gate contact is in contact with the NMOS barrier layer and the PMOS barrier layer.

6. The inverter of claim 1, wherein the gate contact prevents cross diffusion between the PMOS metal gate region and the NMOS metal gate region.

7. The inverter of claim 1, wherein the gate contact has a width and a depth to allow that the gate to prevent cross diffusion between the PMOS metal gate region into the NMOS metal gate region.

8. The inverter of claim 1, wherein the gate contact comprises Tungsten (W).

9. A method for fabricating a metal gate structure for an inverter, comprising:
   forming an insulating layer on top of a p-channel region of a PMOS of the inverter and an n-channel region of a NMOS of the inverter;
   forming a PMOS metal gate region above the p-channel region by:
   forming a PMOS barrier layer above the insulating layer;
   forming one or more PMOS work function layers above the PMOS barrier layer; and
   forming a PMOS metal gate layer above the one or more PMOS work function layers, the PMOS metal gate layer consisting of metal;
   wherein the PMOS barrier layer surrounds the one or more PMOS work function layers and the PMOS metal gate layer;
   forming a NMOS metal gate region above the n-channel region by:
   forming a NMOS barrier layer above the insulating layer;
   forming one or more NMOS work function layers above the NMOS barrier layer; and
   forming a NMOS metal gate layer above the one or more NMOS work function layers, the NMOS metal gate layer consisting of metal;
   wherein the NMOS barrier layer surrounds the one or more NMOS work function layers and the NMOS metal gate layer;
   forming a gate contact, wherein the gate contact having a frusto-conical cross-section is between the NMOS metal gate region and the PMOS metal gate region.

10. The method of claim 9, wherein the gate contact is in contact with the one or more PMOS work function layers, the PMOS metal gate layer, the one or more NMOS work function layers, and the NMOS metal gate layer.

11. The method of claim 9, wherein the gate contact is in contact with the NMOS barrier layer and the PMOS barrier layer.

12. The method of claim 9, wherein the gate contact is formed to have a width and depth to allow the gate contact to prevent cross diffusion between the PMOS metal gate region and the NMOS metal gate region.

13. The method of claim 9, wherein the gate contact is formed using Tungsten (W).

* * * * *